(12) United States Patent
Ohta et al.

(10) Patent No.: US 6,876,258 B2
(45) Date of Patent: Apr. 5, 2005

(54) HIGH-FREQUENCY AMPLIFIER AND RADIO TRANSMISSION DEVICE WITH CIRCUIT SCALE AND CURRENT CONSUMPTION REDUCED TO ACHIEVE HIGH EFFICIENCY

(75) Inventors: Akira Ohta, Hyogo (JP); Akira Inoue, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/987,579

(22) Filed: Nov. 15, 2001

(65) Prior Publication Data

US 2002/0186088 A1 Dec. 12, 2002

(30) Foreign Application Priority Data

Jun. 8, 2001 (JP) ........................................ 2001-173966

(51) Int. Cl.$^7$ ................................................. H03F 3/60
(52) U.S. Cl. ........................ 330/286; 333/1.1; 333/24.2
(58) Field of Search ................................ 333/1.1, 24.2; 330/286

(56) References Cited

U.S. PATENT DOCUMENTS

| 4,309,666 A | * | 1/1982 | Ito et al. ..................... 330/286 |
| 5,905,409 A | | 5/1999 | Fujimoto et al. |
| 5,945,887 A | | 8/1999 | Makino et al. ............... 333/1.1 |
| 6,177,841 B1 | | 1/2001 | Ohta et al. ................... 330/302 |
| 6,437,654 B2 | * | 8/2002 | Maruhashi et al. ........... 333/1.1 |

FOREIGN PATENT DOCUMENTS

| DE | 197 52 216 | 9/1998 |
| JP | 4-107903 | 9/1992 |
| JP | 10-327003 | 12/1998 |
| KR | 2000-0071785 | 11/2000 |
| KR | 2001-0062517 | 7/2001 |
| TW | 280475 | 7/1996 |

OTHER PUBLICATIONS

Krauss et al., Solid State Radio Engineering, 1980, John Wiley &Sons, pp. 418–419.*
U.S. Appl. No. 09/717,215, filed Nov. 22, 2000.

* cited by examiner

Primary Examiner—Stephen E. Jones
(74) Attorney, Agent, or Firm—McDermott Will & Emery LLP

(57) ABSTRACT

A high-frequency amplifier in a power amplifier module includes, on a substrate on which the amplifier is formed, first- and second-stage amplifiers for receiving and amplifying an input signal, a harmonic processing circuit for matching of harmonics included in an output signal from the second-stage amplifier, and a low-pass filter receiving an output from the harmonic processing circuit to selectively pass a signal to be supplied to a non-reciprocal circuit element using a predetermined frequency as a cutoff frequency.

5 Claims, 13 Drawing Sheets

HIGH-FREQUENCY AMPLIFIER AND RADIO TRANSMISSION DEVICE WITH CIRCUIT SCALE AND CURRENT CONSUMPTION REDUCED TO ACHIEVE HIGH EFFICIENCY

BACKGROUND OF THE INVENTION

1. Field of the Invention

The present invention relates to structures of a high-frequency semiconductor amplifier using a high-frequency transistor such as field-effect transistor (hereinafter FET) and of a radio transmission device using the high-frequency semiconductor amplifier. In particular, the present invention relates to structures of a high-frequency amplifier applied to mobile communication equipment and microwave communication equipment except for the mobile communication equipment and of a radio transmission device using the high-frequency amplifier.

2. Description of the Background Art

A radio transmission unit of a mobile terminal device for example is constructed by assembling, on a substrate of insulator, a chip having a high-frequency transistor such as FET formed on a semiconductor substrate.

FIG. 15 is a schematic block diagram illustrating a structure of a radio transmission unit 9000 applied to a conventional mobile terminal device of the type as described above.

Referring to FIG. 15, radio transmission unit 9000 includes a high-frequency amplifier 1010 capable of operating with high efficiency (hereinafter referred to as "high-efficiency amplifier"), a non-reciprocal circuit element 1030 and a transmission line 1020 connecting high-efficiency amplifier 1010 to non-reciprocal circuit element 1030.

High-efficiency amplifier 1010 is assembled in a power amplifier module 100 having an input terminal 10 and an output terminal 20. Input terminal 10 receives a transmission signal which has undergone a predetermined modulation and upconverted to a high frequency to be transmitted. An output of non-reciprocal circuit element 1030 is finally supplied to an antenna (not shown).

High-efficiency amplifier 1010 is formed on a substrate having metallic waveguide lines (transmission lines) such as microstrip lines on an insulator like ceramics or synthetic resin as described above. Specifically, high-efficiency amplifier 1010 is assembled on the substrate from an input matching circuit 104, a chip of a first-stage amplifier 105, an inter-stage matching circuit 106, a chip of a second-stage amplifier 107, and an output matching circuit 1080 arranged in this order between input terminal 10 and output terminal 20 of module 100. Those components on the substrate are connected to the metallic waveguide lines formed in advance on the substrate. Passive elements among the components on the substrate, i.e., input matching circuit 104, inter-stage matching circuit 106 and output matching circuit 1080 may be constructed in advance from a metallic layer on the substrate as the metallic waveguide lines. Fine adjustments are thereafter made to thus constructed passive elements by changing wire connection or the like in the process of assembling.

Output matching circuit 1080 includes a harmonic processing circuit 111 and a fundamental matching circuit 114. Harmonic processing circuit 111 processes harmonics by performing impedance matching for the harmonics. Fundamental matching circuit 114 performs impedance matching for the fundamental.

Non-reciprocal circuit element 1030 includes an isolator 130 for example. An output terminal 40 of non-reciprocal circuit element 1030 is connected to an antenna of a mobile communication device or the like. Non-reciprocal circuit element 1030 in such a mobile communication device enables the amplifier to operate efficiently regardless of the state of the antenna.

One example of the non-reciprocal circuit element is described below that employs an isolator.

Non-reciprocal circuit element 1030 includes an input matching circuit 120 connected to transmission line 1020 and an isolator body 130 connected between input matching circuit 120 and output terminal 40.

High-efficiency amplifier 1010 has an output impedance of 50 ohm and isolator 1030 has an input/output impedance of 50 ohm because the transmission line which has normally been used for high-frequency equipment has its characteristic impedance formed by 50 ohm termination (ohm is hereinafter represented by $\Omega$). The second-stage amplifier 107 has an output impedance from 1 to 10 $\Omega$. Accordingly, fundamental matching circuit 114 is constructed of a converter circuit converting the output impedance (1–10 $\Omega$) of the second-stage amplifier 107 into 50 $\Omega$.

A signal supplied to input terminal 10 is amplified by high-efficiency amplifier 1010. The amplified signal is passed through transmission line 1020 with the characteristic impedance of 50 $\Omega$ and isolator 1030 to be output to the antenna. Any reflected wave generated after isolator 1030 is interrupted by isolator 1030 so that the reflected wave never returns to high-efficiency amplifier 1010. Then, high-efficiency amplifier 1010 can operate in a stable manner with its high-efficiency operation maintained.

In recent years, mobile terminal equipment has been reduced remarkably in size and weight. A major factor in development of the terminal equipment is this reduction in size and weight. The size and weight of the equipment are reduced chiefly by downsizing a battery thereof. It is important, for downsizing of the battery while a certain length of time for speech communication is maintained, to enhance the operational efficiency of the amplifier with its power consumption occupying a large proportion of the entire power consumption of the mobile terminal equipment and consequently reduce the power consumption of the mobile terminal equipment itself.

However, enhancement of the amplifier efficiency is difficult in the structure of radio transmission unit 9000 explained above due to a great loss in fundamental matching circuit 114.

For example, Japanese Patent Laying-Open No. 10-327003 titled "Irreversible Circuit Element and Composite Electronic Component" addresses this problem by efficiency improvement. This document discloses a structure for allowing impedance Z to have a relation 2 $\Omega$<Z<12.5 $\Omega$, where Z represents each of an output impedance of a high-efficiency amplifier, an input impedance of a non-reciprocal circuit element (isolator) and a characteristic impedance of a line connecting the high-efficiency amplifier and the non-reciprocal circuit element.

FIG. 16 is a block diagram showing a structure of a radio transmission unit 9200 using a low-impedance isolator disclosed by the above-mentioned document.

Referring to FIG. 16, radio transmission unit 9200 is formed of a low-impedance high-efficiency amplifier 101, a low-impedance transmission line 102 and a low-impedance isolator 103.

Low-impedance high-efficiency amplifier 101 has an output impedance lower than the characteristic impedance 50 $\Omega$ of the normal transmission line described above and low-impedance isolator 103 has an input impedance which is also lower than 50 Ω. On the other hand, the output impedance of isolator 103 is designed to be the normal characteristic impedance 50 Ω.

In the structure shown in FIG. 16, the output impedance of high-efficiency amplifier 101 is in the range of 1 Ω to 10 Ω (corresponding to the output impedance of the second-stage amplifier 107) for example. An input matching circuit 111 of isolator 103 adjusts the input impedance of low-impedance isolator 103 to the output impedance of high-efficiency amplifier 101.

It is thus possible in the structure shown in FIG. 16 to construct high-efficiency amplifier 101 without fundamental matching circuit. Consequently, the loss generated in the output matching circuit can be avoided to reduce power consumption of the whole structure including high-efficiency amplifier 101 and isolator 103.

Input matching circuit 111 of low-impedance isolator 103 has a so-called C-L-C $\pi$ type low-pass filter 113.

Low-pass filter 113 removes a harmonic component from an output of low-impedance high-efficiency amplifier 101.

The structure shown in FIG. 16 has a problem discussed below.

Low-impedance transmission line 102 is present between high-efficiency amplifier 101 serving as a power amplifier module and low-impedance isolator 103.

The input impedance of low-impedance isolator 103 in the structure as shown in FIG. 16 changes within a frequency band.

It is supposed here that the impedance is 10 Ω at the lowest frequency fl in the band and the impedance changes to 11 Ω at the highest frequency fh.

It is further supposed that transmission line 102 has an inductance represented by L. Then, the output end of high-efficiency amplifier 101 has an impedance with respect to the isolator that is $(10+j2\pi flL)$ Ω (J: imaginary unit) at frequency fl while the impedance is $(11+j2\pi fhL)$ Ω at frequency fh. The variation of the impedance within the band is represented by expression (1) below:

$$\sqrt{\{1+2\pi L(fl-fh)^2\}} \quad (1)$$

Accordingly, the variation of the impedance within the band increases with increase of inductor L. As a result, amplification efficiency which is one of characteristics of high-efficiency amplifier 101 deteriorates due to a relatively great impedance variation compared with the output impedance of amplifier 101.

SUMMARY OF THE INVENTION

One object of the present invention is to provide a highly efficient high-frequency amplifier operating with low current consumption having its circuit scale prevented from increasing and having its characteristics prevented from deteriorating and, to provide a radio transmission device using the high-frequency amplifier.

In summary, according to one aspect of the present invention, a high-frequency amplifier is connectable to a non-reciprocal circuit element having its input impedance lower than its output impedance. The high-frequency amplifier includes a substrate, an amplifier element, a harmonic processing circuit, and a filter element.

The amplifier element is provided on the substrate for receiving and amplifying an input signal. The harmonic processing circuit is provided on the substrate for matching of harmonics included in an output signal from the amplifier element. The filter element is provided on the substrate to receive an output from the harmonic processing circuit for selectively passing a signal to be supplied to the non-reciprocal circuit element by using a predetermined frequency as a cutoff frequency.

According to another aspect of the present invention, a radio transmission device for supplying a high-frequency signal is provided. The radio transmission device includes an amplifier element, a substrate, a harmonic processing circuit, a filter element, a first transmission line, and a non-reciprocal circuit element.

The amplifier element receiving and amplifying an input signal is arranged on the substrate. The harmonic processing circuit is provided on the substrate for matching of harmonics included in an output signal from the amplifier element. The filter element has at least its part provided on the substrate to receive an output from the harmonic processing circuit for selectively passing the output by using a predetermined frequency as a cutoff frequency. The first transmission line transmits the output from the filter element. The non-reciprocal circuit element receives a signal from the transmission line for non-reciprocally transmitting the signal in the direction in which the signal is transmitted from the transmission line, the non-reciprocal circuit element having an input impedance lower than an output impedance.

The present invention thus provides advantages as described below. The high-frequency amplifier and the radio transmission device according to the invention include the filter element operating as a low-pass filter that is provided on the output side of the harmonic processing circuit, the filter element operating to remove harmonics. The number of elements necessary for harmonic removal can be reduced to avoid increase of the circuit scale and prevent deterioration of characteristics. Accordingly, it is possible to amplify high-frequency signals with high efficiency and low current consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
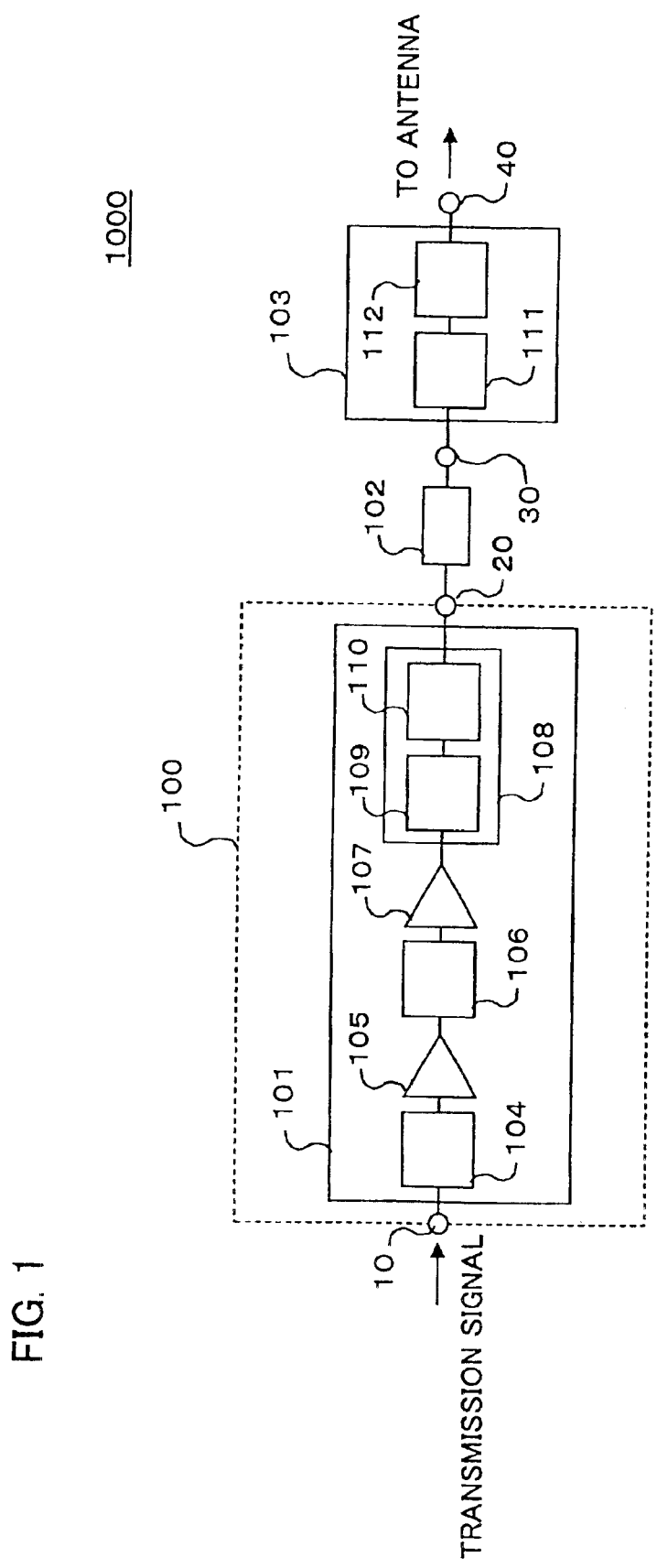
FIG. 1 is a schematic block diagram illustrating a structure of a radio transmission device 1000.

Embodiments of the present invention are hereinafter described in conjunction with the drawings where the same or corresponding components are denoted by the same reference character and description thereof is not repeated here.

Figure 15:
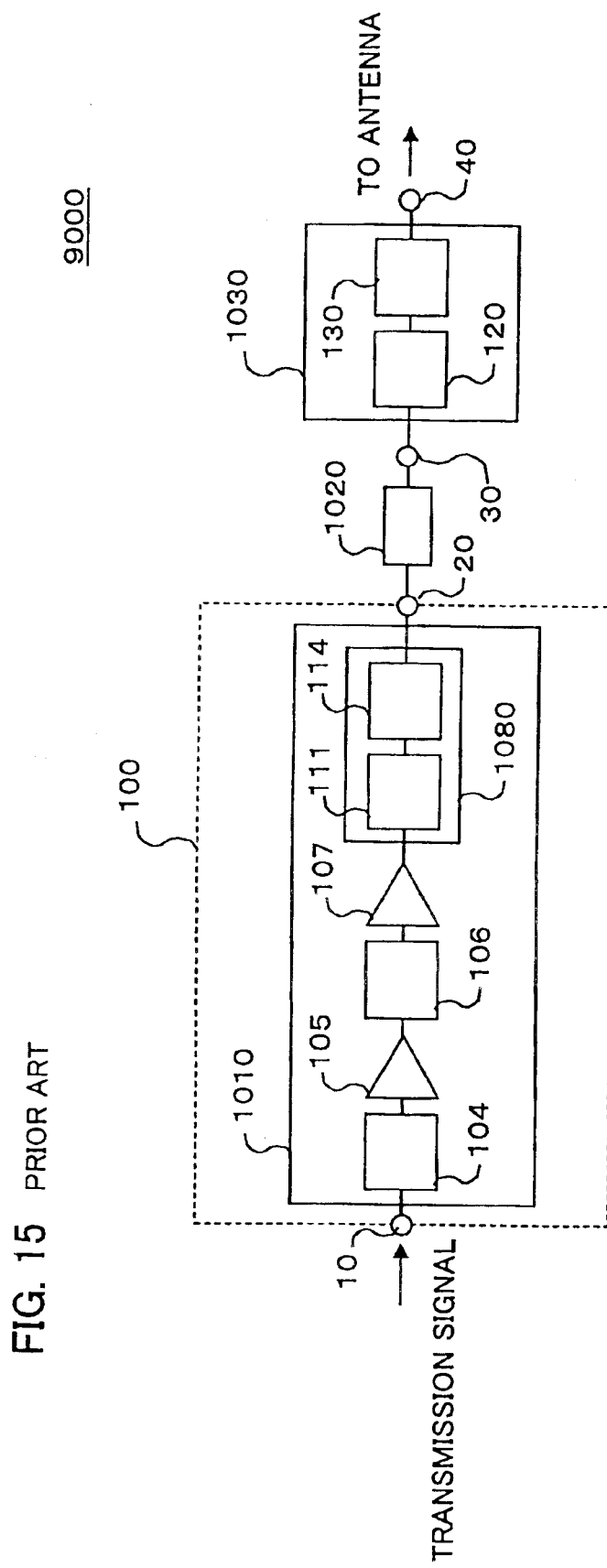
FIG. 15 is a schematic block diagram illustrating a structure of a radio transmitting unit 9000 applied to conventional mobile terminal equipment.

FIG. 1 is a schematic block diagram illustrating a structure of a radio transmission device 1000 for solving the problem of the conventional device shown in FIG. 15.

Radio transmission device 1000 is described below as a device transmitting a high-frequency signal having its frequency within or higher than the microwave frequency band, however, the high-frequency signal is not particularly limited to such a signal.

Referring to FIG. 1, radio transmission device 1000 includes a high-efficiency amplifier 101, a low-impedance transmission line 102 for connecting high-efficiency amplifier 101 to a non-reciprocal circuit element 103, and non-reciprocal circuit element 103.

High-efficiency amplifier 101 assembled in a power amplifier module 100 includes an input matching circuit 104, a first-stage amplifier 105, an inter-stage matching circuit 106, a second-stage amplifier 107, and an output matching circuit 108. Output matching circuit 108 includes a harmonic processing circuit 109 and a fundamental adjusting circuit 110.

Although the high-efficiency amplifier has amplifiers of two stages as shown in FIG. 1, the number of stages could increase or decrease depending on a required gain.

Non-reciprocal circuit element 103 includes an input matching circuit 111 and an isolator body 112.

High-efficiency amplifier 101 has its input impedance substantially equal to the normal impedance value, namely 50 Ω, and its output impedance lower than the normal value 50 Ω which is specifically in the range of 3 to 30 Ω for example. Non-reciprocal circuit element 103 has its input impedance lower than the normal value 50 Ω and its output impedance substantially equal to the normal value 50 Ω. Accordingly, non-reciprocal circuit element 103 is hereinafter referred to as "low-impedance isolator 103."

In order to efficiently operate the amplifier regardless of the state of an antenna in a mobile communication device for example, low-impedance isolator 103 is provided between the antenna and high-efficiency amplifier 101 as provided in the conventional device.

A signal from an input terminal 10 is amplified by high-efficiency amplifier 101 and the amplified signal is passed through transmission line 102 and low-impedance isolator 103 to be supplied to an output terminal 40. The output from output terminal 40 is finally supplied to the antenna (not shown).

A reflected wave generated after output terminal 40 is interrupted by low-impedance isolator 103 so that the reflected wave never returns to the output of high-efficiency amplifier 101. It is then possible for high-efficiency amplifier 101 to operate in a stable manner with its high-efficiency operation maintained.

Fundamental adjusting circuit 110 is described below.

As explained above, the output impedance of low-impedance isolator 103 has the normal value 50 Ω while the input impedance thereof is approximately 3 to 30 Ω for example. Then, fundamental adjusting circuit 110 of output matching circuit 108 in high-efficiency amplifier 101 is not required to convert the impedance to a considerable degree.

In other words, if the input impedance of non-reciprocal circuit element 103 is not in the range of 3 to 30 Ω as mentioned above but equal to the normal value of 50 Ω, an impedance converter circuit in fundamental adjusting circuit 110 must convert the output impedance of high-efficiency amplifier 101 from 1 to 10 Ω for example to the characteristic impedance 50 Ω of the normal transmission line.

However, the structure shown in FIG. 1 dispenses with such an impedance converter circuit. Then, the structure has no loss as that generated in the impedance converter circuit and consequently consumes less current to achieve a high-efficiency operation.

On the other hand, mismatch could arise due to variation in the input impedance of low-impedance isolator 103 as well as variation in the characteristic impedance of the transmission line connecting low-impedance high-efficiency amplifier 101 to low-impedance isolator 103. Accordingly, radio transmission device 1000 uses fundamental adjusting circuit 110 for making fine adjustments to the impedance with respect to the fundamental instead of fundamental matching circuit 114 for converting the output impedance of the second-stage amplifier 107 from 1–10 Ω to 50 Ω.

Figure 2:
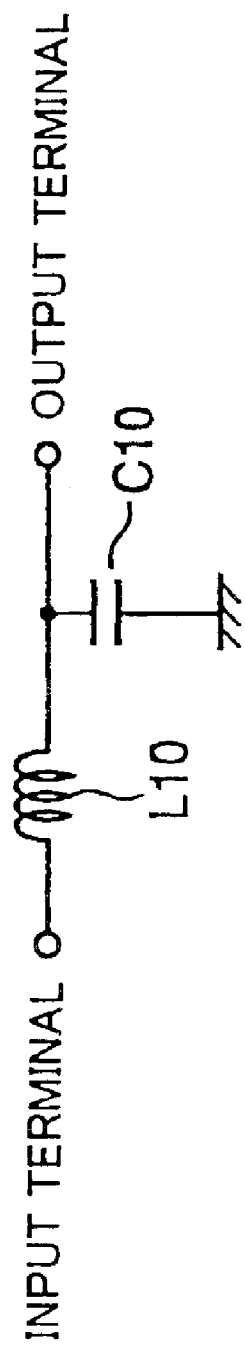
FIG. 2 is a circuit diagram showing one example of a fundamental adjusting circuit 110.

FIG. 2 is a circuit diagram showing one example of fundamental adjusting circuit 110.

Fundamental adjusting circuit 110 shown in FIG. 2 is formed of an inductor L10 connected between an input terminal and an output terminal and a capacitor C10 connected between the output terminal and a ground node GND receiving the ground potential. Inductor L1 and capacitor C10 constitute a low-pass filter.

Fundamental adjusting circuit 110 converts the impedance by an amount corresponding to approximately several ohms that is smaller than the amount by which the impedance is converted by the conventional fundamental matching circuit 114. Fundamental adjusting circuit 110 thus has a smaller power loss than that of the conventional fundamental matching circuit 114 shown in FIG. 15.

If such fine adjustments are unnecessary, fundamental adjusting circuit 110 may not be provided.

Harmonic processing circuit 109 is described below.

In the structure shown in FIG. 1, harmonic processing circuit 109 formed of LC resonant circuits for removing harmonics is provided between the output of the second-stage amplifier 107 and fundamental adjusting circuit 110 in order to eliminate harmonic leakage power.

Harmonic processing circuit 109 in output matching circuit 108 is provided for matching of harmonics. For example, harmonic processing circuit 109 has a circuit structure for harmonic impedance matching, a circuit structure for reducing harmonic leakage power, and the like. With respect to the harmonic impedance matching, harmonic processing circuit 109 has a circuit structure providing a short-circuit load with a sufficiently small impedance for higher harmonic (even harmonic or odd harmonic) or a circuit structure providing an open-circuit load with a sufficiently large impedance for higher harmonic, for example. The resonant circuits constituting harmonic processing circuit 109 are described later.

A reason why harmonic processing circuit 109 is provided between the second-stage amplifier (amplifier of the last stage) 107 and low-impedance isolator 103 is discussed below. Here, a comparison is made between harmonic processing circuit 109 connected to the output of the isolator and harmonic processing circuit 109 connected to the input of the isolator (corresponding to the structure shown in FIG. 1). If harmonic processing circuit 109 is connected to the output of the isolator, the characteristic impedance 50 Ω of the connecting part allows harmonic leakage power to be smaller than that of the structure shown in FIG. 1 where the characteristic impedance is smaller. However, if the harmonic processing circuit 109 is connected to the output of the isolator, harmonic has a small reflectance relative to the second-stage amplifier 107. Then, the harmonic processing cannot improve the efficiency of the second-stage amplifier 107.

On the other hand, in the structure shown in FIG. 1, harmonic processing circuit 109 is connected between the second-stage amplifier 107 and low-impedance isolator 103 so that improvement of the efficiency of the second-stage amplifier 107 by the harmonic processing as well as reduction in harmonic leakage power can simultaneously be achieved.

Figure 3:
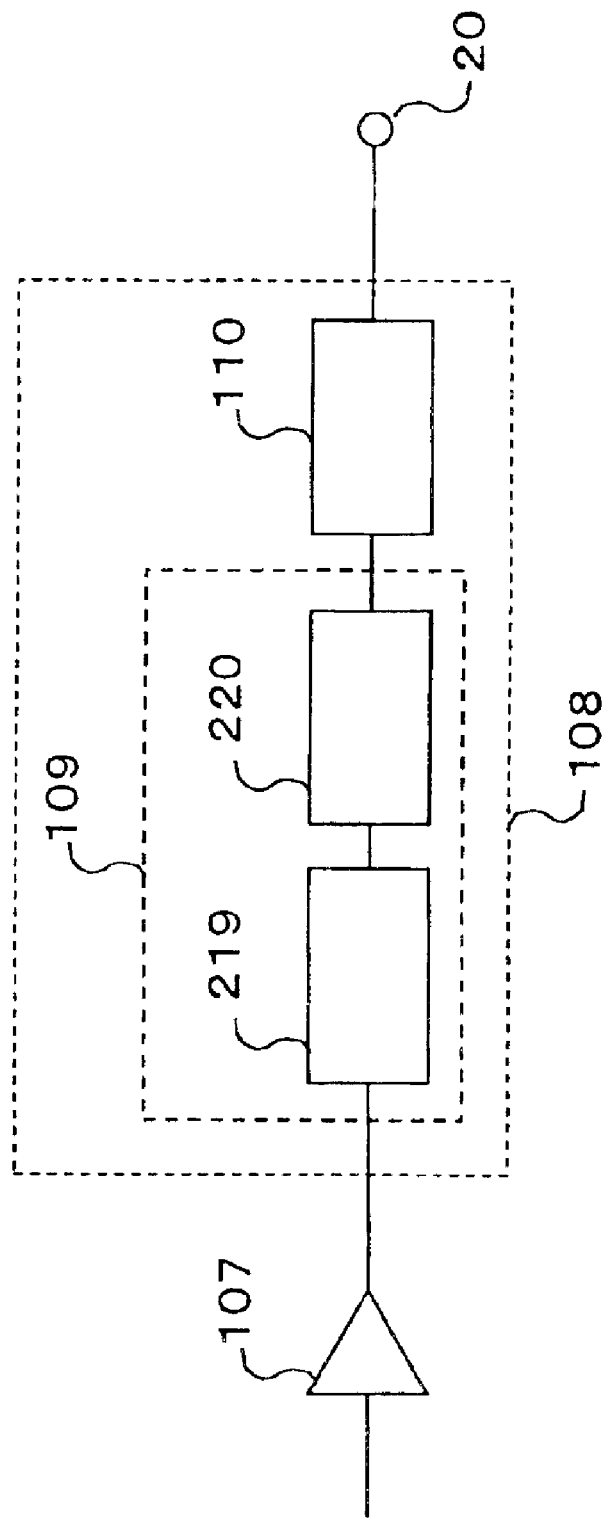
FIG. 3 is a schematic block diagram showing one example of a harmonic processing circuit 109.

FIG. 3 is a schematic block diagram showing one example of harmonic processing circuit 109. Harmonic processing circuit 109 shown in FIG. 3 includes a third harmonic matching circuit 219 and a second harmonic matching circuit 220 connected between the second-stage amplifier 107 and fundamental adjusting circuit 110.

For example, the second harmonic matching circuit 220 is structured to provide an open-circuit load with a sufficiently large impedance for even harmonic and the third harmonic matching circuit 219 is structured to provide a short-circuit load with a sufficiently small impedance for odd harmonic. Then, the second-stage amplifier has an improved efficiency and accordingly the current consumption can be reduced.

Figure 4:
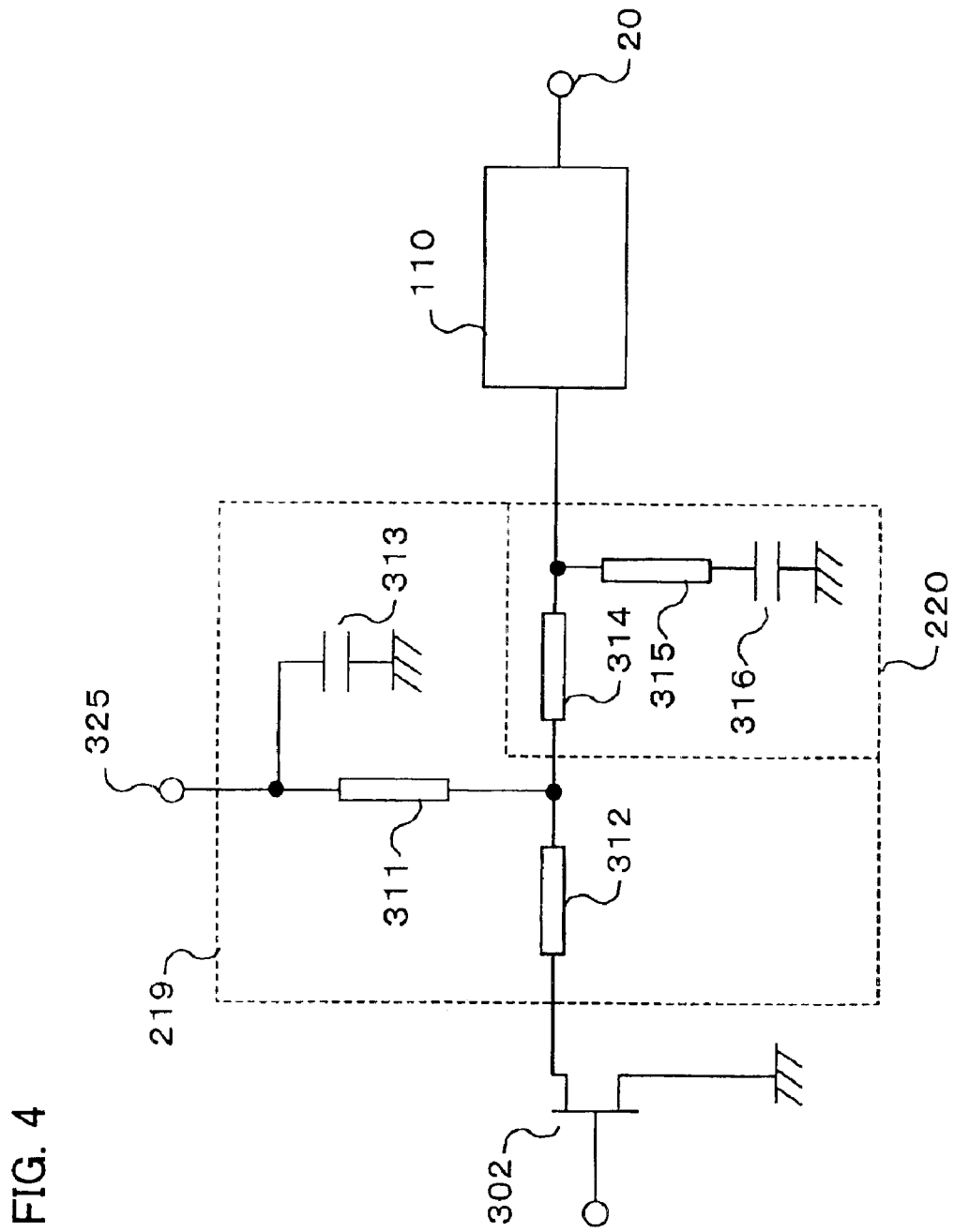
FIG. 4 more specifically shows a structure of harmonic processing circuit 109.

FIG. 4 specifically shows the structure of harmonic processing circuit 109.

Referring to FIG. 4, the third harmonic matching circuit 219 includes a drain bias line 311, a signal line 312 and a capacitor 313 and the second harmonic matching circuit 220 includes signal lines 314 and 315 and a capacitor 316. The drain of an FET 302 included in the second-stage amplifier 107 is connected to signal line 312 and the source thereof is grounded.

Signal line 312 is connected to a drain bias terminal 325 supplying a bias voltage via drain bias line 311. Capacitor 313 is connected between drain bias terminal 325 and the ground potential. Between signal line 312 and the ground potential, signal line 315 and capacitor 316 are connected.

These signal lines are represented equivalently by inductance.

The harmonic processing circuit formed of resonant circuits having inductors and capacitors is structured specifically by chip capacitors and inductor elements provided on a substrate, or structured by capacitor elements and parasitic inductors such as chip capacitors and microstrip transmission lines or chip capacitors and interstitial via holes provided in a substrate.

Although two harmonic eliminating circuits are provided in FIG. 4, the number of the circuits is not limited thereto and a plurality of such circuits, for example, three or more harmonic eliminating circuits may be arranged.

In addition, although one frequency is subjected to the harmonic processing here, the harmonic processing may be performed for a plurality of frequencies.

[Problem of Radio Transmission Device 1000]

The structure as shown in FIG. 1 can be used to perform a high-efficiency operation. However, harmonic processing circuit 109 requires LC resonant circuits for harmonic removal by the number equal to the number of harmonics that should be removed.

For example, in order to remove the second, third and fourth harmonics, LC resonant circuits each formed of two components, namely, a chip inductor and a chip capacitor, are used and accordingly six chip components (3×2=6) are required. A resultant problem is that downsizing of the high-efficiency amplifier is difficult.

[First Embodiment]

Figure 5:
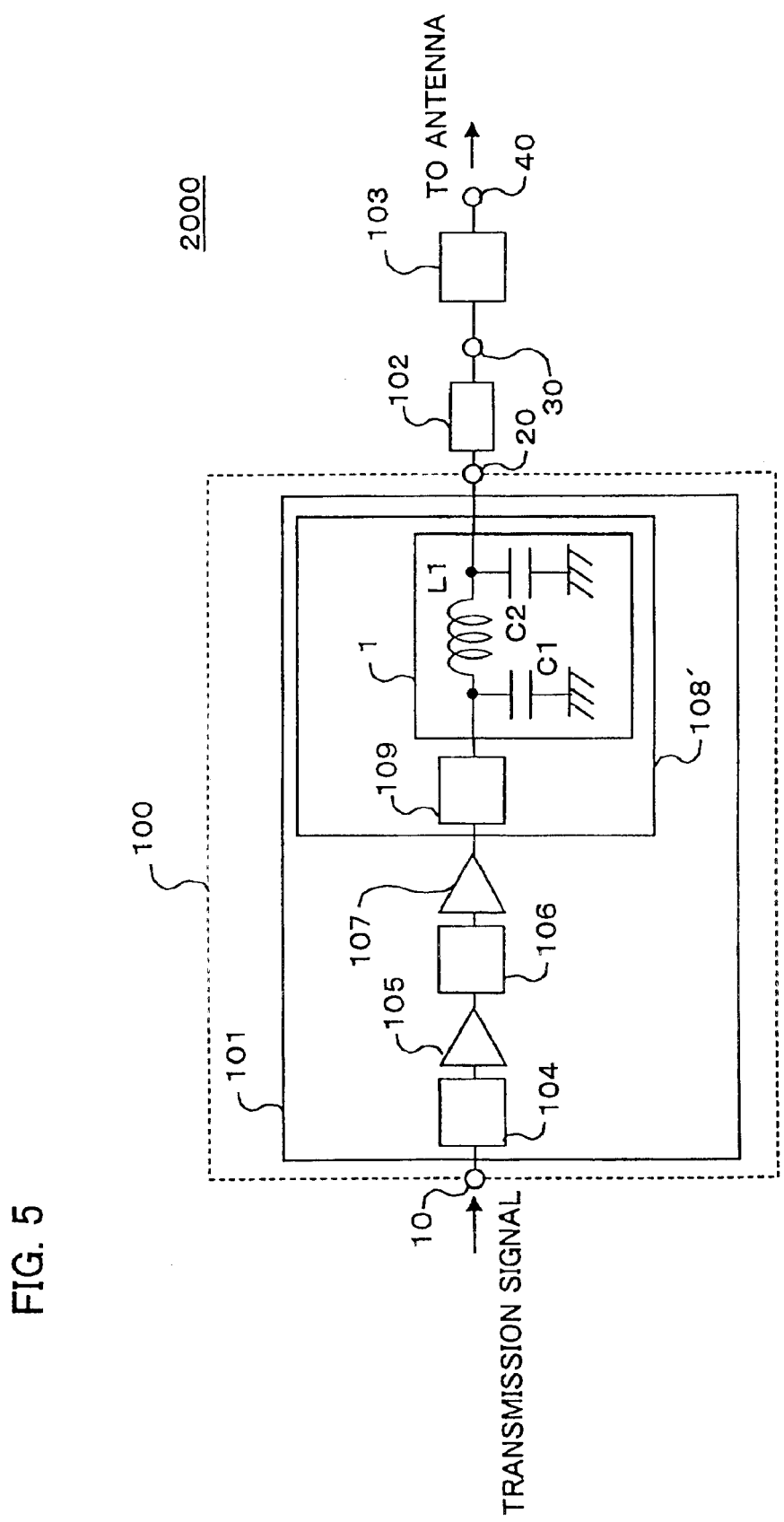
FIG. 5 is a schematic block diagram illustrating a structure of a radio transmission device 2000 according to a first embodiment of the present invention.

FIG. 5 is a schematic block diagram illustrating a structure of a radio transmission device 2000 according to a first embodiment of the present invention, the structure being provided for solving the above-described problem, i.e., difficulty in downsizing of the high-efficiency amplifier, which is explained above in connection with power amplifier module 100 shown in FIG. 1.

Radio transmission device 2000 differs from radio transmission device 1000 shown in FIG. 1 in that the former includes an output matching circuit 108' instead of output matching circuit 108.

Referring to FIG. 5, output matching circuit 108' of a high-efficiency amplifier 101 includes a harmonic processing circuit 109 and a low-pass filter 1. In other words, high-efficiency amplifier 101 of the first embodiment is constructed to connect low-pass filter 1 immediately after harmonic processing circuit 109 which is connected to an output of a second-stage amplifier 107.

The structure shown in FIG. 1 requires harmonic eliminating circuits constituted of a plurality of LC resonant circuits arranged in harmonic processing circuit 109, in order to reduce harmonic leakage power.

On the other hand, in high-efficiency amplifier 101 according to the first embodiment of the present invention shown in FIG. 5, only one low-pass filter circuit 1 may be provided to eliminate all harmonic components so that the circuit scale can be reduced.

Moreover, low-pass filter 1 is implemented by a so-called C-L-C π type filter formed of capacitors C1 and C2 and an inductor L1 and accordingly the amount by which the impedance is converted by low-pass filter 1 can be made small. Consequently, the efficiency of high-efficiency amplifier 101 can be enhanced.

In the structure shown in FIG. 5, low-pass filter 1 is connected immediately after harmonic processing circuit 109 connected to the output of the second-stage amplifier.

Figure 16:
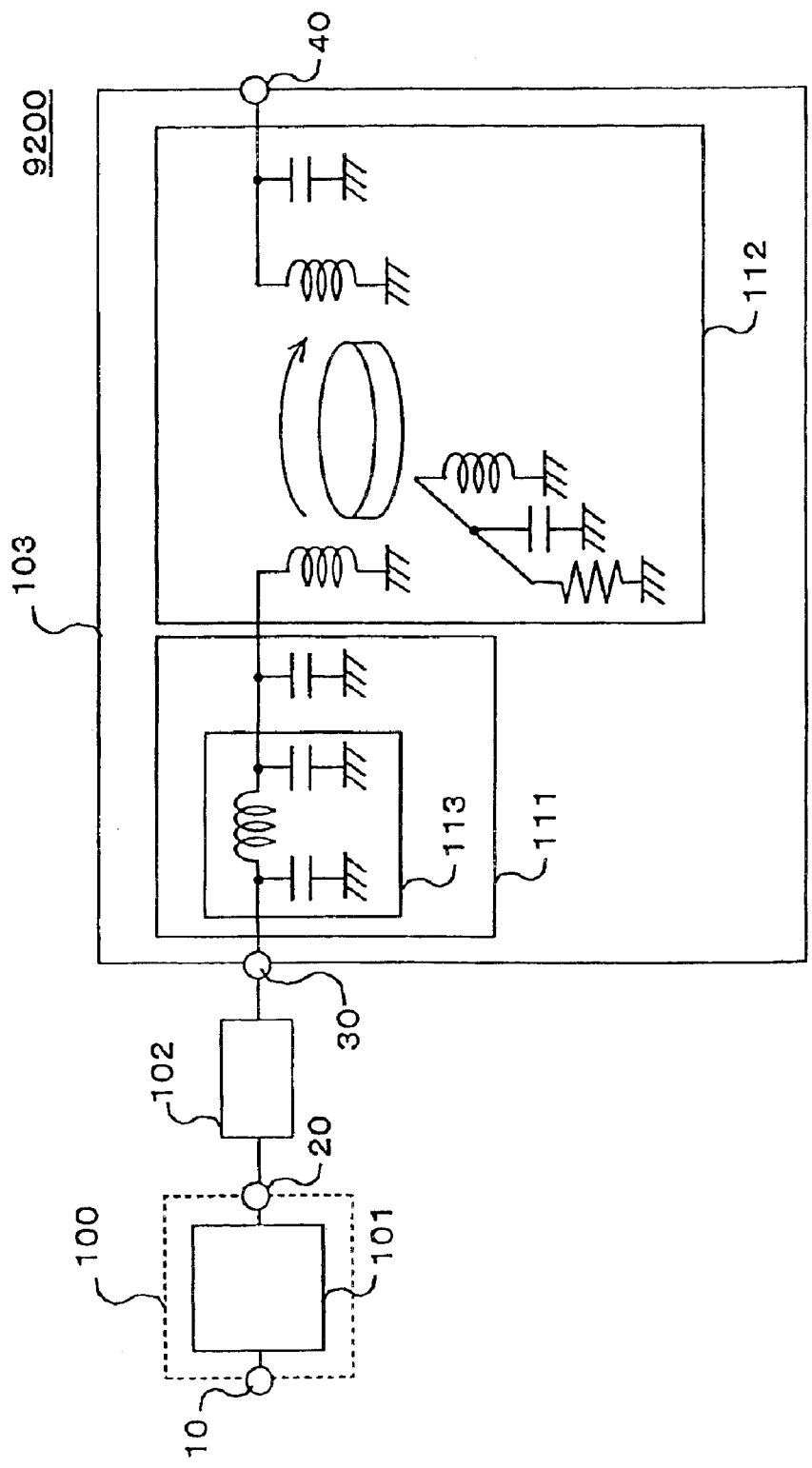
FIG. 16 is a block diagram showing an example of a conventional structure of a radio transmitting unit 9200 employing a low-impedance isolator.

Then, the amount of impedance variation in the operating frequency band, occurring from high-efficiency amplifier 101 to the isolator, never increases, the increase caused by the inductance of transmission line 102 as found in the example shown in FIG. 16. Thus, high-efficiency amplifier 101 can be structured to operate efficiently with small distortion without deterioration of its characteristics such as the efficiency and distortion.

Low-pass filter 1 discussed above may have a cutoff frequency fc in the range of $f_o<fc<2f_o$ if harmonics with twice or higher frequency are to be eliminated. Here, $f_o$ represents a fundamental frequency.

[Second Embodiment]

Figure 6:
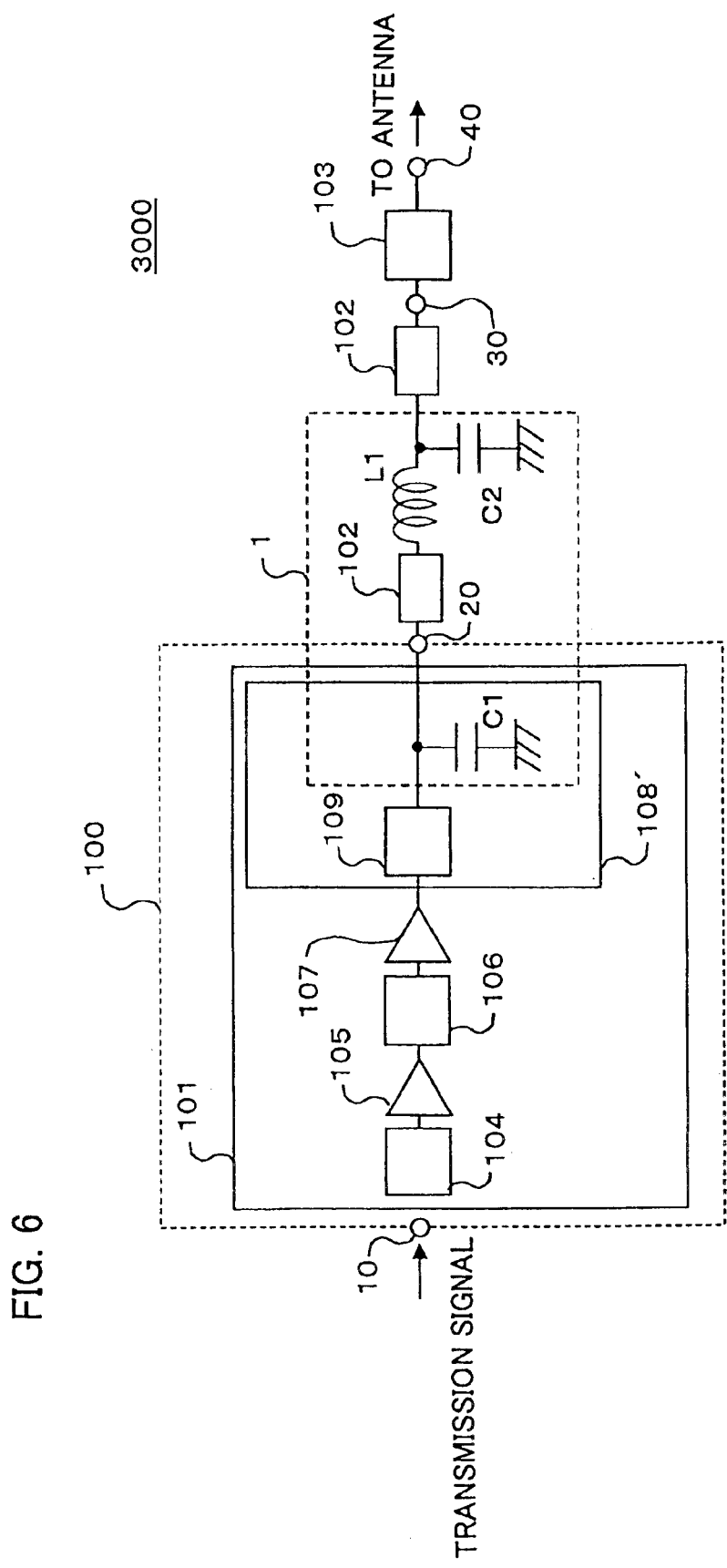
FIG. 6 is a schematic block diagram showing structures of a high-efficiency amplifier 101 and a radio transmission device 3000 according to a second embodiment of the present invention.

FIG. 6 is a schematic block diagram showing structures of a high-efficiency amplifier 101 and a radio transmission device 3000 using the amplifier according to a second embodiment of the present invention.

In radio transmission device 3000 shown in FIG. 6, only capacitor C1, which is provided on the side of harmonic processing circuit 109, among components in low-pass filter 1 of the first embodiment is arranged within a substrate constituting high-efficiency amplifier 101. Inductor L1 and capacitor C2 of the first embodiment are arranged along a signal line between an output terminal 20 of a power amplifier module 100 and an isolator 103. Inductor L1 and capacitor C2 are implemented by a chip inductor and a chip capacitor, however, inductor L1 and capacitor C2 are not particularly limited thereto.

Figure 7:
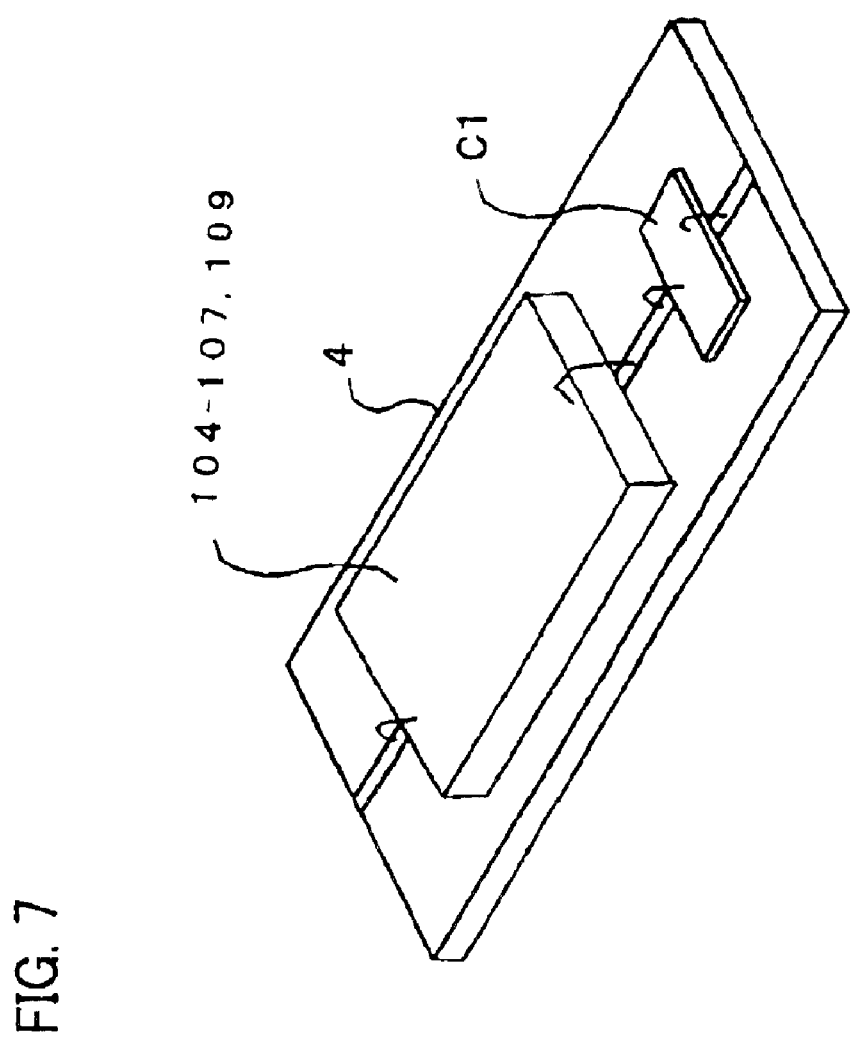
FIG. 7 conceptually shows a structure, viewed from above, including the high-efficiency amplifier 101 assembled on a substrate 4.

High-efficiency amplifier 101 is assembled by arranging chip components on a substrate of insulator like resin or ceramics as described above. FIG. 7 shows a structure including high-efficiency amplifier 101 assembled on a substrate 4 that is viewed from above. Here, high-efficiency amplifier 101 is a surface-mount component.

In the structures as shown in FIGS. 6 and 7, the number of components constituting high-efficiency amplifier 101 determines the area of high-efficiency amplifier 101 and accordingly determines the area of substrate 4. Here, a larger area of substrate 4 forming high-efficiency amplifier 101 leads to increase of cost.

Then, it is necessary for reduction of the substrate area and cost to decrease the number of components constituting high-efficiency amplifier 101.

The structure of radio transmission device 3000 shown in FIG. 6 can include a smaller number of components of high-efficiency amplifier 101 compared with that of the first embodiment shown in FIG. 5. Namely, the number of components can be decreased by at least two which are the chip capacitor and chip inductor. Consequently, the high-efficiency amplifier can be reduced in size. Then, the area of substrate 4 for high-efficiency amplifier 101 can be decreased to cut the cost.

Here, a low-pass filter 1 may also have cutoff frequency fc in the range of $f_o<fc<2f_o$ if harmonics with twice or higher frequency are to be eliminated.

In addition, it is possible to reduce harmonic leakage power by arranging the chip capacitor of low-pass filter 1 that is located on the side of the isolator closer to the input terminal of the isolator.

[Third Embodiment]

Figure 8:
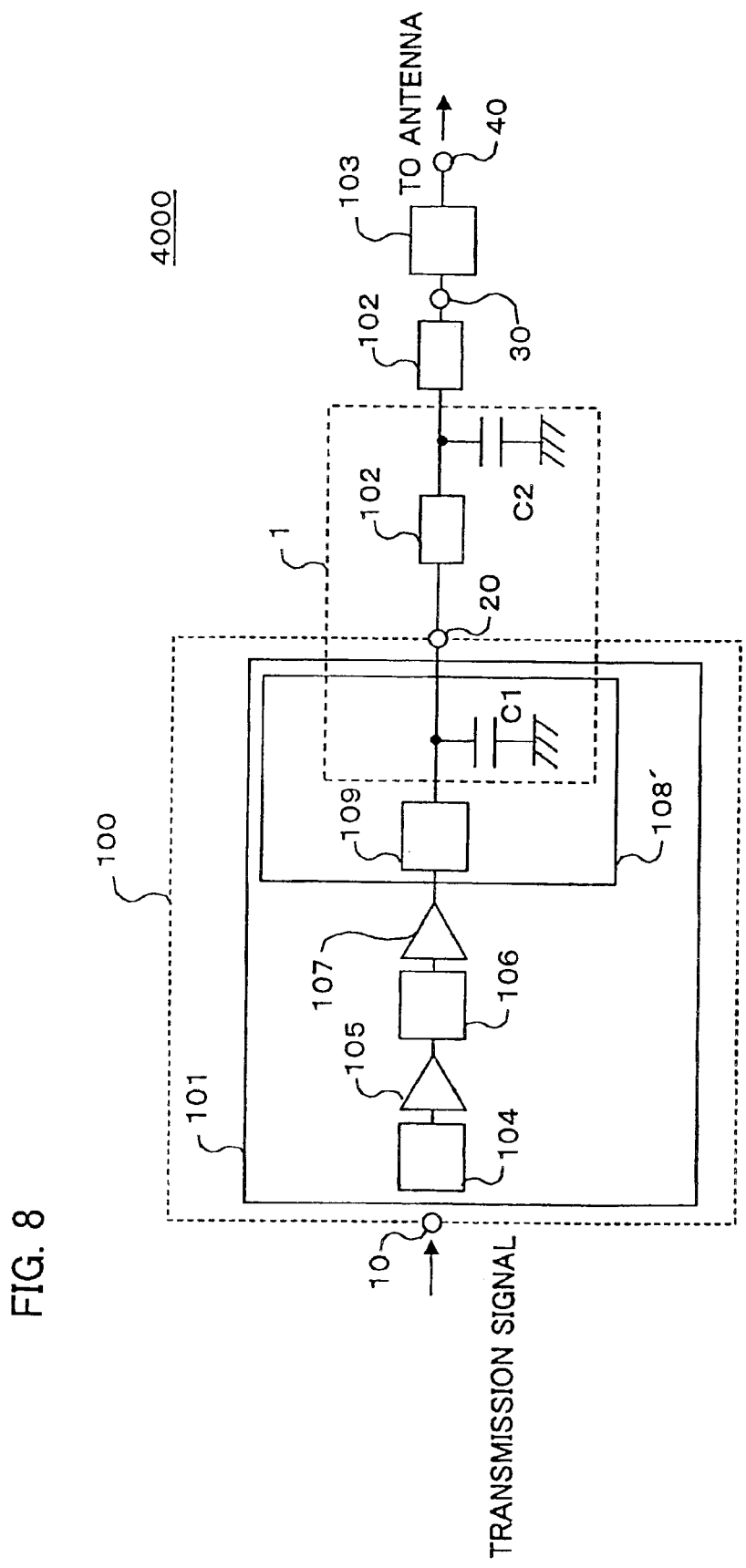
FIG. 8 is a schematic block diagram showing structures of a high-efficiency amplifier 101 and a radio transmission device 4000 according to a third embodiment of the present invention.

FIG. 8 is a schematic block diagram showing structures of a high-efficiency amplifier 101 and a radio transmission device 4000 using the amplifier according to a third embodiment of the present invention.

Different from the structure of the second embodiment, the structure of radio transmission device 4000 according to the third embodiment uses, as an inductor of a low-pass filter 1, inductance L of a transmission line 102 provided between high-efficiency amplifier 101 and a capacitor C2 on the side of an isolator 103, instead of the chip inductor of the second embodiment. This structure can accordingly have a smaller number of chip components than that of the radio transmission device of the second embodiment so that the size and cost of the radio transmission device can further be reduced.

Here, low-pass filter 1 mentioned above may also have cutoff frequency fc in the range of $f_o<fc<2f_o$ if harmonics with twice or higher frequency are to be eliminated.

[Fourth Embodiment]

Figure 9:
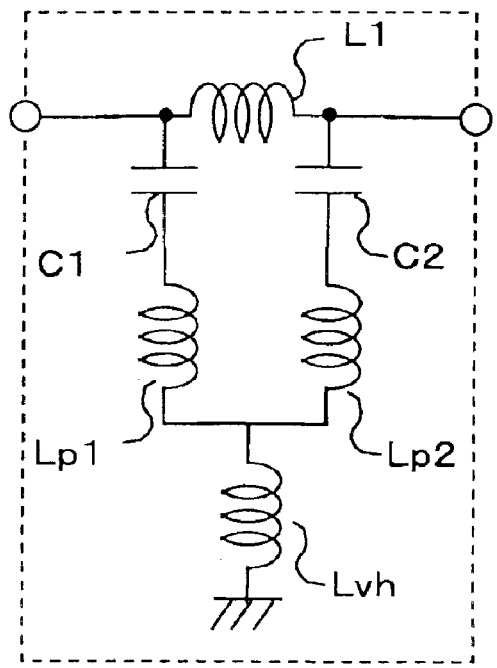
FIG. 9 is a circuit diagram showing a structure of a low-pass filter 1 together with parasitic impedance components used for the high-efficiency amplifier 101 of the first embodiment shown in FIG. 5.

FIG. 9 is a circuit diagram showing a structure of low-pass filter 1 together with parasitic impedance components used for high-efficiency amplifier 101 of the first embodiment shown in FIG. 5.

Figure 10:
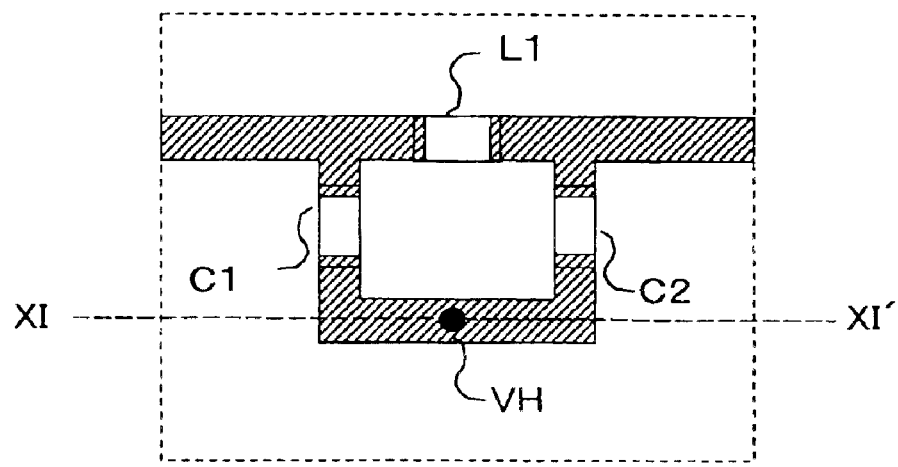
FIG. 10 is a plan view illustrating the low-pass filter 1 shown in FIG. 9 formed on a substrate.
Figure 11:
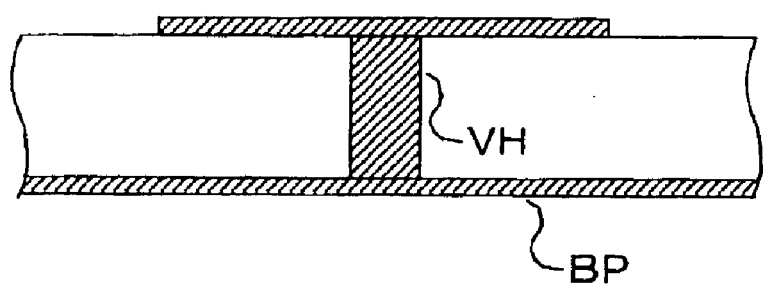
FIG. 11 is a cross sectional view along line XI–XI' of FIG. 10.

FIG. 10 is a plan view illustrating low-pass filter 1 shown in FIG. 9 formed on a substrate and FIG. 11 is a cross sectional view along line XI–XI' of FIG. 10.

As shown in FIG. 9, two capacitors C1 and C2 in the π type filter of C-L-C of the first embodiment are grounded.

In this case, the capacitors C1 and C2 can be grounded as shown in FIGS. 10 and 11 by connecting respective one ends of capacitors C1 and C2 on the substrate and then connecting them to a ground plane BP at a lower level by means of a via hole VH provided in the substrate.

Consequently, parasitic inductance Lp1 and parasitic inductance Lp2 of a pattern on the surface of the substrate are connected in series to capacitors C1 and C2 respectively as seen from the equivalent circuit shown in FIG. 9.

Additionally, parasitic inductance Lvh of the line in the via hole is connected in series between the ground and a coupling node of parasitic inductance Lp1 and parasitic inductance Lp2 of the wiring pattern on the substrate surface.

As a result, this parasitic inductance Lvh increases loss in the low-pass filter.

Then, according to the fourth embodiment, low-pass filter 1 used for high-efficiency amplifier 101 of the first embodiment shown in FIG. 5 having the structure as shown in FIGS. 9 to 11 is replaced with a low-pass filter having a structure described below.

Figure 12:
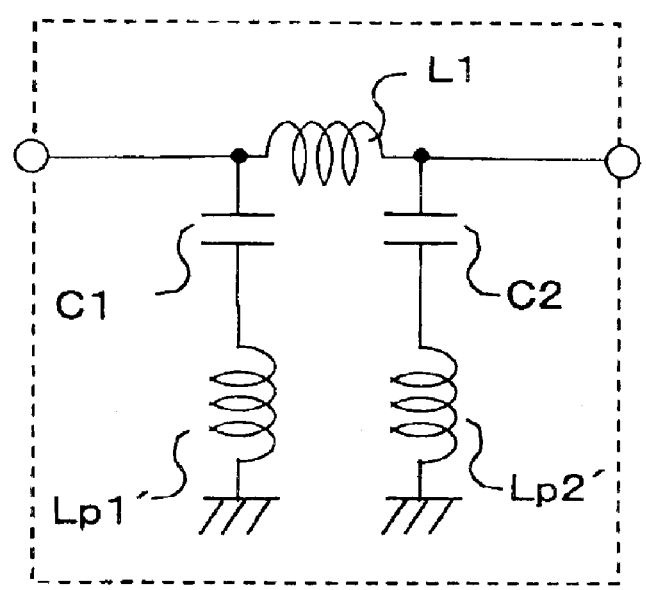
FIG. 12 is a circuit diagram showing a structure of a low-pass filter 1 together with parasitic impedance components used for a high-efficiency amplifier 101 according to a fourth embodiment of the present invention.

FIG. 12 is a circuit diagram showing the structure of low-pass filter 1 together with parasitic impedance components used for a high-efficiency amplifier 101 according to the fourth embodiment of the present invention.

Figure 13:
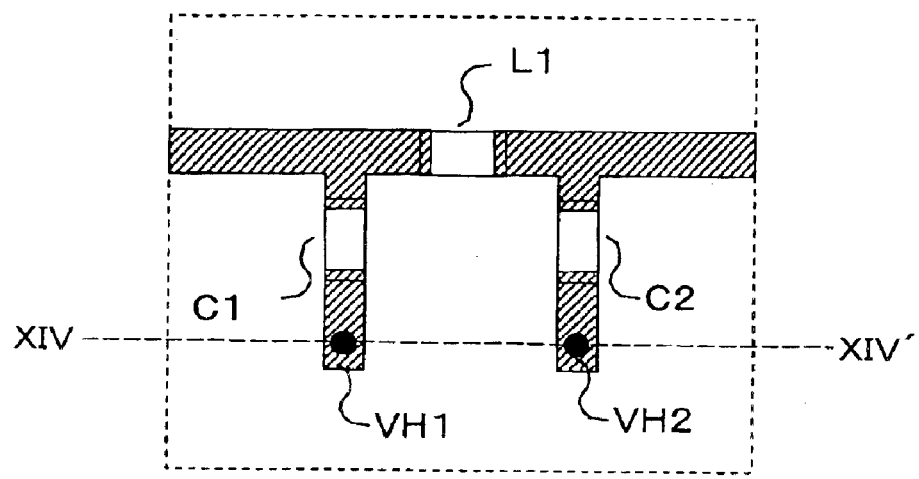
FIG. 13 is a plan view illustrating the low-pass filter 1 shown in FIG. 12 formed on a substrate.
Figure 14:
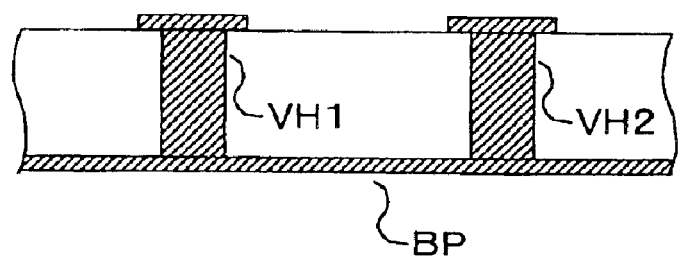
FIG. 14 is a cross sectional view along line XIV–XIV' of FIG. 13.

FIG. 13 is a plan view illustrating low-pass filter 1 shown in FIG. 12 formed on a substrate and FIG. 14 is a cross sectional view along line XIV–XIV' of FIG. 13.

The π type C-L-C filter of the fourth embodiment shown in FIGS. 12 to 14 has the structure including two capacitors C1 and C2 with respective one ends connected to a ground plane BP on the rear side of the substrate by means of metal lines in via holes formed in the substrate.

Accordingly, parasitic inductance component Lp1' or Lp2' per capacitor C1 or C2 of low-pass filter 101 can be made smaller than that of the structure shown in FIGS. 9 to 11. Even if an output of the second-stage amplifier is decreased, a desired power output can be obtained.

In other words, the desired power output can be obtained even if the second-stage amplifier is operated to supply a smaller output value, which is advantageous for enhancement of efficiency and reduction of distortion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high-frequency amplifier connectable to a non-reciprocal circuit element having an input impedance lower than an output impedance, comprising:

a substrate;

an amplifier element provided on said substrate for receiving and amplifying an input signal;

a harmonic processing circuit provided on said substrate for providing a proper output load of harmonics included in an output signal from said amplifier element to improve an efficiency of said amplifier element; and a filter element provided directly on said substrate to receive an output from said harmonic processing circuit for selectively passing a signal to be supplied to said non-reciprocal circuit element by using a predetermined frequency as a cutoff frequency.

2. The high-frequency amplifier according to claim 1, wherein said amplifier element amplifies a fundamental frequency represented by $f_o$ and said predetermined frequency represented by fc satisfies a relation of $f_o<fc<2f_o$.

3. The high-frequency amplifier according to claim 1, wherein the output impedance of said non-reciprocal circuit element is substantially 50 ohm, and an output impedance of said high-frequency amplifier and the input impedance of said non-reciprocal circuit element are substantially in the range of 3 ohm to 30 ohm.

4. The high-frequency amplifier according to claim 1, wherein first and second via holes are formed in said substrate for connection of a front side of said substrate with a ground electrode provided on a rear side of said substrate, said high-frequency amplifier further comprises said ground electrode, and said filter element includes:

a first signal line provided on said substrate to extend from an output of said harmonic processing circuit to said non-reciprocal circuit element;

an inductor arranged on said first signal line;

a second signal line provided on said first signal line to extend from a first node on an input side of said inductor to said ground electrode via said first via hole;

a first capacitor provided on said second signal line on said substrate;

a third signal line provided on said first signal line to extend from a second node on an output side of said inductor to said ground electrode via said second via hole; and a second capacitor provided on said third signal line on said substrate.

5. An amplifier module connectable to a non-reciprocal circuit element having an input impedance lower than an output impedance, the amplifier module comprising:

an input terminal for receiving an input signal, an output terminal for providing connection to said non-reciprocal circuit element, an amplifier element responsive to the input signal for producing an amplified signal, a harmonic processing circuit responsive to the amplified signal for providing a proper output load of harmonics included in the amplified signal to improve an efficiency of said amplifier element, and a filter element provided between the harmonic processing circuit and the output terminal of the amplifier module for performing frequency filtering of a signal produced by said harmonic processing circuit in order to pass to the output terminal an output signal in a predetermined range of frequencies.

* * * * *